(12) United States Patent
Schelle et al.

(10) Patent No.: US 9,652,410 B1
(45) Date of Patent: May 16, 2017

(54) AUTOMATED MODIFICATION OF CONFIGURATION SETTINGS OF AN INTEGRATED CIRCUIT

(71) Applicant: Xilinx, Inc., San Jose, CA (US)

(72) Inventors: Graham F. Schelle, Longmont, CO (US); Paul R. Schumacher, Berthoud, CO (US); Patrick Lysaght, Los Gatos, CA (US); Yi-Hua Yang, San Jose, CA (US); Anthony Brandon, Delft (NL)

(73) Assignee: XILINX, INC., San Jose, CA (US)

( * ) Notice: Subject to any disclaimer, the term of this patent is extended or adjusted under 35 U.S.C. 154(b) by 170 days.

(21) Appl. No.: 14/278,470

(22) Filed: May 15, 2014

(51) Int. Cl.
*G06F 9/44* (2006.01)
*H03K 19/177* (2006.01)
*G06F 13/10* (2006.01)

(52) U.S. Cl.
CPC ............... *G06F 13/10* (2013.01); *G06F 9/44* (2013.01); *H03K 19/17756* (2013.01)

(58) Field of Classification Search
None
See application file for complete search history.

(56) References Cited

U.S. PATENT DOCUMENTS

| | | | | |
|---|---|---|---|---|
| 5,596,708 A * | 1/1997 | Weber | ................... | G06F 3/0601 714/42 |
| 6,326,806 B1 * | 12/2001 | Fallside | .............. | G06F 15/7867 326/38 |
| 7,268,582 B1 * | 9/2007 | Zheng | .............. | H03K 19/17732 326/38 |
| 7,577,726 B1 * | 8/2009 | Conard | ................... | G06F 8/665 709/221 |
| 8,099,625 B1 * | 1/2012 | Tseng | .................... | G06F 11/142 703/21 |
| 8,415,974 B1 * | 4/2013 | Lysaght | ........... | H03K 19/17752 326/39 |
| 9,203,408 B1 * | 12/2015 | Peng | ..................... | H03K 19/003 |
| 2004/0141386 A1 * | 7/2004 | Karlsson | ............. | G06F 17/5054 365/200 |
| 2005/0068831 A1 * | 3/2005 | Johnson | .............. | G06F 13/1689 365/222 |
| 2009/0006659 A1 * | 1/2009 | Collins | ............... | H04L 63/0245 710/8 |

(Continued)

OTHER PUBLICATIONS

Description and drawings from U.S. Appl. No. 13/398,790, filed Feb. 16, 2012, Schumacher et al.

(Continued)

*Primary Examiner* — Nitin Patel
*Assistant Examiner* — Kevin Stewart
(74) *Attorney, Agent, or Firm* — Kevin T. Cuenot

(57) ABSTRACT

Automated modification of configuration settings for an IC (IC) includes receiving, within a data processing system, desired data for a configuration setting of an IC, reading stored data for the configuration setting. A determination is made using the data processing system that the configuration setting is static and that the stored data differs from the desired data. Responsive to the determination, configuration data including the desired data is provided from the data processing system to the IC. At least a portion of a boot process of the IC is automatically initiated, wherein the boot process uses the configuration data.

20 Claims, 4 Drawing Sheets

(56) References Cited

U.S. PATENT DOCUMENTS

| | | | | |
|---|---|---|---|---|
| 2009/0128189 A1* | 5/2009 | Madurawe | ....... | H03K 19/17796 326/41 |
| 2009/0132799 A1* | 5/2009 | Brumley | ............ | G06F 9/44505 713/100 |
| 2010/0058274 A1* | 3/2010 | Pike | ........................ | H04L 45/60 716/128 |
| 2011/0154313 A1* | 6/2011 | Nolterieke | ................ | G06F 8/68 717/170 |
| 2012/0060039 A1* | 3/2012 | Leclercq | ................. | G06F 21/10 713/189 |
| 2012/0151021 A1* | 6/2012 | Bolay | ................. | G06F 9/44505 709/221 |

OTHER PUBLICATIONS

Description and drawings from U.S. Appl. No. 13/797,721, filed Mar. 12, 2013, Lysaght et al.

\* cited by examiner

AUTOMATED MODIFICATION OF CONFIGURATION SETTINGS OF AN INTEGRATED CIRCUIT

TECHNICAL FIELD

This disclosure relates to integrated circuits (ICs) and, more particularly, to automatically modifying configuration settings of an IC.

BACKGROUND

A system-on-chip (SOC) is an integrated circuit (IC) that includes a plurality of different subsystems. The subsystems are included within a single chip substrate. The subsystems of the SOC are integrated to work cooperatively with one another. One example of an SOC is a chip level implementation of a computer or other data processing system. For example, the SOC may include a processor that executes program code such as an operating system. The processor operates cooperatively with one or more other on-chip subsystems. The other subsystems may be digital circuits, analog circuits, mixed-signal circuits, or the like. Exemplary subsystems that may be included within an SOC and operate cooperatively with a processor may include, but are not limited to, wireless transceivers, signal processors, CODECs, memory, I/O peripherals, memory controllers, and the like.

The subsystems of the SOC often are so varied and specialized that the SOC manufacturer chooses to obtain one or more of the subsystems from third-party Intellectual Property (IP) providers rather than design the subsystems internally. Each subsystem typically has one or more configuration settings that control the functionality and/or behavior of the subsystem. In the usual case, a subsystem has hundreds or thousands of different configuration settings. Taking a system-wide view, the number of configuration settings of an SOC may be overwhelming to a user of the SOC attempting to implement a circuit design therein.

Further, many configuration settings may be changed only under specific circumstances and by following specific procedures. When the user wishes to change configuration settings from the default configuration settings of one or more subsystems in an attempt to achieve improved performance, the user must know the precise circumstances and procedures to be followed for each such subsystem. If the circumstances are not observed and the procedures not followed, attempted changes to the configuration settings do not take effect within the SOC. The user, however, may not be aware that the desired change to the configuration setting was not implemented.

SUMMARY

A method includes receiving, within a data processing system, desired data for a configuration setting of an integrated circuit (IC), reading stored data for the configuration setting. The method also includes determining, using the data processing system, that the configuration setting is static and that the stored data differs from the desired data. The method further includes, responsive to the determining, providing configuration data including the desired data from the data processing system to the IC and automatically initiating at least a portion of a boot process of the IC using the configuration data.

A system includes a processor programmed to initiate executable operations. The executable operations include receiving desired data for a configuration setting of an IC, reading stored data for the configuration setting, and determining that the configuration setting is static and that the stored data differs from the desired data. The executable operations also include, responsive to the determining, providing configuration data including the desired data to the IC. The executable operations further include automatically initiating at least a portion of a boot process of the IC using the configuration data.

A non-transitory computer-readable medium has instructions stored thereon which, when executed by a processor, perform a method. The method includes receiving, within a data processing system including the processor, desired data for a configuration setting, reading stored data for the configuration setting from the IC, and determining, using the processor of the data processing system, that the configuration setting is static and that the stored data differs from the desired data. The method also includes, responsive to the determining, providing configuration data including the desired data from the data processing system to the IC and automatically initiating at least a portion of a boot process of the IC using the configuration data.

DETAILED DESCRIPTION

Figure 1:
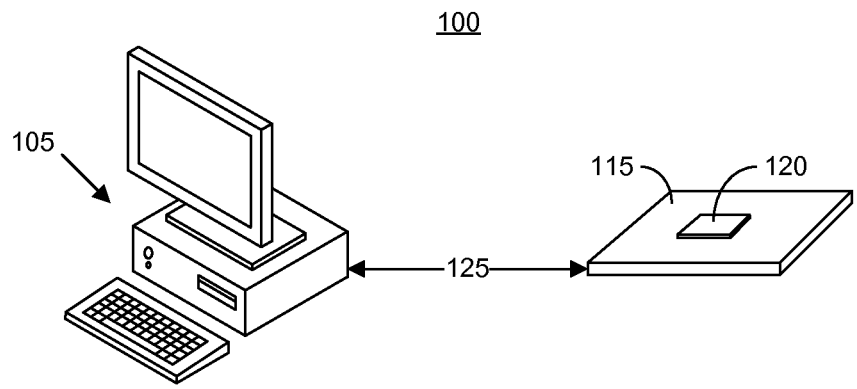
FIG. 1 is a block diagram illustrating an exemplary development system.

While the disclosure concludes with claims defining novel features, it is believed that the various features described within this disclosure will be better understood from a consideration of the description in conjunction with the drawings. The process(es), machine(s), manufacture(s) and any variations thereof described herein are provided for purposes of illustration. Specific structural and functional details described within this disclosure are not to be interpreted as limiting, but merely as a basis for the claims and as a representative basis for teaching one skilled in the art to variously employ the features described in virtually any appropriately detailed structure. Further, the terms and phrases used within this disclosure are not intended to be limiting, but rather to provide an understandable description of the features described.

This disclosure relates to integrated circuits (ICs) and, more particularly, to automatically modifying configuration settings of an IC. The IC may be a system-on-chip (SOC) type of IC. In accordance with the inventive arrangements disclosed herein, one or more configuration settings of an IC may be automatically updated or changed. The IC may include a plurality of different subsystems that operate cooperatively forming an SOC. A system designer, e.g., a user, may specify desired data for configuration settings of the IC. Existing, or stored, values for the configuration settings within the IC may be read from the IC and compared with the desired data.

In one aspect, a determination is made whether the configuration settings of the IC require updating. For example, responsive to determining that desired data does not match stored data, a determination is made that the configuration setting requires updating. Further, a determination may be made as to whether the configuration setting to be updated is static or dynamic. In the case of a static configuration setting, for example, a boot process of the IC may be implemented using the desired data for the configuration setting. Implementation of the boot process with the desired data causes the configuration setting to be changed from the stored data to the desired data.

In one aspect, the boot process may reset the IC. In another aspect, however, the boot process may start at a particular stage where the configuration setting may be updated with the desired data. Accordingly, while implementing the boot process, in whole or in part, the desired data for the configuration setting is applied to the IC. The desired data is reliably and automatically updated within the IC. Further, unnecessary updating and/or resetting of the IC is avoided in cases where the desired data matches the stored data within the IC for a configuration setting.

For purposes of simplicity and clarity of illustration, elements shown in the figures have not necessarily been drawn to scale. For example, the dimensions of some of the elements may be exaggerated relative to other elements for clarity. Further, where considered appropriate, reference numbers are repeated among the figures to indicate corresponding, analogous, or like features.

FIG. 1 is a block diagram illustrating an exemplary development system 100. As pictured, development system 100 includes a data processing system 105. Data processing system 105, for example, may be implemented as a computer system or the like. Data processing system 105 is coupled to a target platform 115 through a communication link 125. Target platform 115 includes an IC 120.

Within this disclosure, the term "data processing system" means the apparatus or system through which a user interacts to provide desired data for configuration settings. The data processing system further interacts with target platform 115 and IC 120 coupled thereto. While one type of SOC that may be implemented by IC 120 is a data processing system, e.g., a computer, for purposes of discussion and clarity, IC 120 is referred to within this disclosure as IC 120, the IC, and/or the SOC. The term "data processing system" is used to refer to the system and/or apparatus that interacts with IC 120.

Target platform 115 may be implemented as a circuit board such as a printed circuit board having circuitry implemented thereon. Target platform 115 may include one or more connectors that couple to communication link 125, whether mechanically and electrically or wirelessly. The connector may be coupled, using circuitry of target platform 115, to a socket, receptacle, or other housing that physically and electrically couples IC 120 to target platform 115. In another aspect, IC 120 may be physically and electrically coupled to target platform 115 without a socket, receptacle, or housing. For example, IC 120 may be directly coupled, e.g., soldered and/or attached using adhesive, to target platform 115. In either case, IC 120 couples to the connector of target platform 115 and to communication link 125.

In one aspect, IC 120 is a programmable IC. In another aspect, IC 120 is an SOC. IC 120 includes a plurality of subsystems that operate cooperatively with one another. For example, IC 120 may include a processor, or processor system, one or more hardwired circuit blocks dedicated for performing a particular function such as transceivers, memory controllers, I/O peripherals, CODECs, and the like. IC 120 also may include programmable circuitry. The inclusion of programmable circuitry, however, is not required. Further, the particular subsystem examples provided herein are for purposes of illustration only and are not intended as limitations.

As noted, data processing system 105 is coupled to target platform 115 through communication link 125. Communication link 125 may be implemented as any of a variety of different connections. Exemplary implementations of communication link 125 include, but are not limited to, point-to-point Ethernet, Universal Serial Bus (USB), FireWire (IEEE 1394 interface), or the like. Communication link 125 further may be implemented as any of a variety of different wireless communication links such as Bluetooth®, Wi-Fi®, or the like. In the case of a wireless implementation of communication link 125, the connector of target platform 115 may be implemented as a wireless transceiver. The exemplary communication links noted within this disclosure are provided for purposes of illustration and not intended as limitations.

In operation, a user interacts with data processing system 105. Working through data processing system 105, the user specifies desired data for any of a variety of different configuration settings of IC 120. The desired data may be data for one or more different configuration settings. Further, the desired data may be for the configuration setting(s) of one or more different subsystems of IC 120.

Data processing system 105 reads the currently stored data from IC 120 for the configuration setting and determines whether the stored data for the configuration setting read from IC 120 matches the desired data. If so, no further configuration, or re-configuration as the case may be, of IC 120 is required. If not, data processing system 105 determines whether the configuration setting is static or dynamic.

As defined herein, the term "static configuration setting" means a configuration setting that requires implementation of a boot process in order to change the value of the configuration setting. As defined herein, the term "dynamic configuration setting" means a configuration setting that does not require implementation of a boot process for the IC in order to change the value of the configuration setting. A dynamic configuration setting is one where the value of the configuration setting may be changed during operation of the IC without performing the boot process, or a portion of the boot process, for the IC.

In the case of a static configuration setting, data processing system 105 evaluates the configuration setting in relation to a boot process of IC 120. For example, data processing system 105 determines a selected one of a plurality of different stages that, taken collectively, form the boot process. The selected stage is the particular stage where the configuration setting of IC 120 must be updated. Data processing system 105 generates any necessary configuration data including the desired data, provides the configuration data to IC 120 via communication link 125, and initiates the boot process using the configuration data.

The boot process may, but need not be, a complete reset of IC 120 or a partial reset or implementation of the boot process. For example, the boot process may be started from the selected stage, which may not be the first stage of the boot process, thereby resulting in implementation of a partial boot process. Thus, a partial boot process is where less than all stages of the boot process are performed.

Figure 2:
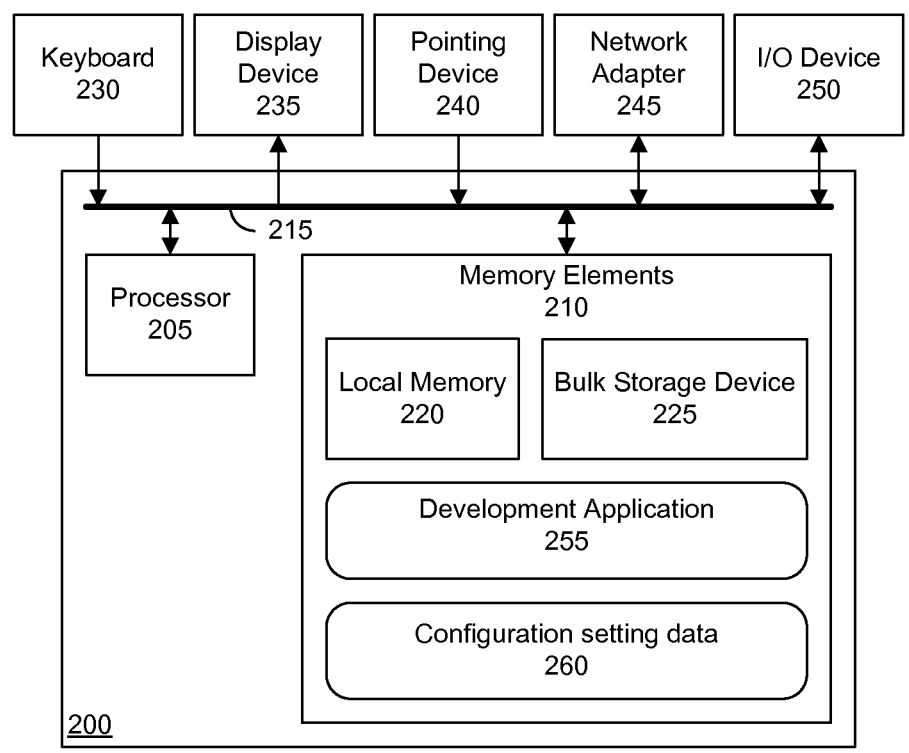
FIG. 2 is a block diagram illustrating an exemplary architecture for the data processing system of FIG. 1.

FIG. 2 is a block diagram illustrating an exemplary architecture 200 for data processing system 105 of FIG. 1. Architecture 200 includes at least one processor, e.g., a central processing unit (CPU), 205 coupled to memory elements 210 through a system bus 215 or other suitable circuitry. Architecture 200 stores program code within memory elements 210. Processor 205 executes the program code accessed from memory elements 210 via system bus 215. In one aspect, architecture 200 may be used to implement a computer or other data processing system that is suitable for storing and/or executing program code. It should be appreciated, however, that architecture 200 may be used to implement any system including a processor and memory that is capable of performing the functions described within this disclosure.

Memory elements 210 include one or more physical memory devices such as, for example, a local memory 220 and one or more bulk storage devices 225. Local memory 220 may be implemented as a random access memory (RAM) or other non-persistent memory device generally used during actual execution of the program code. Bulk storage device 225 may be implemented as a hard disk drive (HDD), solid state drive (SSD), or other persistent data storage device. Architecture 200 also may include one or more cache memories (not shown) that provide temporary storage of at least some program code in order to reduce the number of times program code must be retrieved from the bulk storage device during execution.

Input/output (I/O) devices such as a keyboard 230, a display device 235, and a pointing device 240 optionally can be coupled to architecture 200. The I/O devices may be coupled to architecture 200 either directly or through intervening I/O controllers. A network adapter 245 also may be coupled to architecture 200 to enable a system implemented using architecture 200 to become coupled to other systems, computer systems, remote printers, remote storage devices through intervening private or public networks, and/or target platform 115 of FIG. 1. Modems, cable modems, Ethernet cards, and wireless transceivers are examples of different types of network adapter 245 that can be used with architecture 200. An input/output (I/O) device 250 such as a USB port, a FireWire port, or the like also may be coupled to architecture 200 to allow a system implemented using architecture 200 to become coupled to other systems such as any of the aforementioned systems including target platform 115 of FIG. 1.

As pictured in FIG. 2, memory elements 210 can store a development application 255 and configuration setting data 260. In one aspect, development application 255 may include a plurality of different components or modules (not shown). For example, development application 255 may include support program code such as a driver for communicating with target platform 115.

Configuration setting data 260 may include a plurality of entries. For example, each configuration setting of IC 120 may be listed within configuration setting data 260 as an entry. Each entry, for example, may specify the configuration setting and whether the configuration setting is static or dynamic. For static configuration settings, the configuration setting data 260 further may specify a particular stage of the multistage boot process of IC 120 where the configuration setting must be updated.

While configuration setting data 260 is pictured as being stored in the same data processing system as development data 255, this need not be the case. Configuration setting data 260, for example, may be stored in a data processing system that is separate from, but communicatively linked with, the data processing system executing development application 255.

Being implemented in the form of executable program code, development application 255 is executed by architecture 200. As such, development application 255 is considered part of a system implemented using architecture 200. Architecture 200, while executing development application 255, communicates with target platform 115 of FIG. 1. Development application 255 and any data items used, generated, and/or operated upon by architecture 200 executing development application 255 are functional data structures that impart functionality when employed as part of architecture 200.

Figure 3:
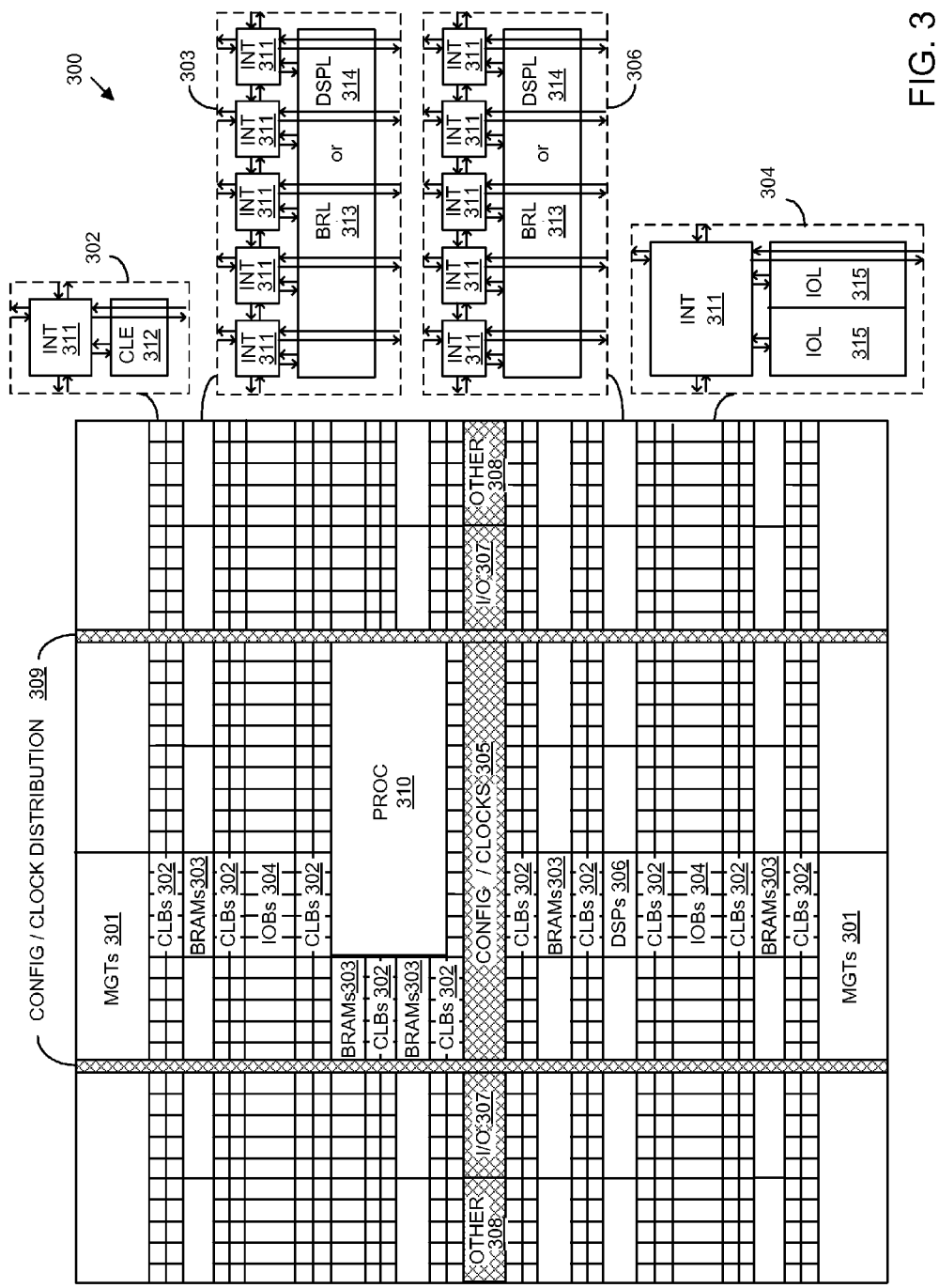
FIG. 3 is a block diagram illustrating an exemplary architecture for an integrated circuit (IC).

FIG. 3 is a block diagram illustrating an exemplary architecture 300 for an IC. For example, architecture 300 may be used to implement IC 120 of FIG. 1. In one aspect, architecture 300 is implemented within a field programmable gate array (FPGA) type of IC. Further, architecture 300 is one example of an SOC.

As shown, architecture 300 includes several different types of programmable circuit, e.g., logic, blocks. For example, architecture 300 can include a large number of different programmable tiles including multi-gigabit transceivers (MGTs) 301, configurable logic blocks (CLBs) 302, random access memory blocks (BRAMs) 303, input/output blocks (IOBs) 304, configuration and clocking logic (CONFIG/CLOCKS) 305, digital signal processing blocks (DSPs) 306, specialized I/O blocks 307 (e.g., configuration ports and clock ports), and other programmable logic 308 such as digital clock managers, analog-to-digital converters, system monitoring logic, and so forth.

In some ICs, each programmable tile includes a programmable interconnect element (INT) 311 having standardized connections to and from a corresponding INT 311 in each adjacent tile. Therefore, INTs 311, taken together, implement the programmable interconnect structure for the illustrated IC. Each INT 311 also includes the connections to and from the programmable logic element within the same tile, as shown by the examples included at the top of FIG. 3.

For example, a CLB 302 can include a configurable logic element (CLE) 312 that can be programmed to implement user logic plus a single INT 311. A BRAM 303 can include a BRAM logic element (BRL) 313 in addition to one or more INTs 311. Typically, the number of INTs 311 included in a tile depends on the height of the tile. As pictured, a BRAM tile has the same height as five CLBs, but other numbers (e.g., four) also can be used. A DSP tile 306 can include a DSP logic element (DSPL) 314 in addition to an appropriate number of INTs 311. An 10B 304 can include, for example, two instances of an I/O logic element (IOL) 315 in addition to one instance of an INT 311. As will be clear to those of skill in the art, the actual I/O pads connected, for example, to IOL 315 typically are not confined to the area of IOL 315.

In the example pictured in FIG. 3, a columnar area near the center of the die, e.g., formed of regions 305, 307, and 308, can be used for configuration, clock, and other control logic. Horizontal areas 309 extending from this column are used to distribute the clocks and configuration signals across the breadth of the programmable IC.

Some ICs utilizing the architecture illustrated in FIG. 3 include additional logic blocks that disrupt the regular columnar structure making up a large part of the IC. The additional logic blocks can be programmable blocks and/or dedicated circuitry. For example, a processor block depicted as PROC 310 spans several columns of CLBs and BRAMs.

In one aspect, PROC 310 is implemented as dedicated circuitry, e.g., as a hard-wired processor, that is fabricated as part of the die that implements the programmable circuitry of the IC. PROC 310 can represent any of a variety of different processor types and/or systems ranging in complexity from an individual processor, e.g., a single core capable of executing program code, to an entire processor system having one or more cores, modules, co-processors, interfaces, or the like.

The phrase "programmable circuitry" can refer to programmable circuit elements within an IC, e.g., the various programmable or configurable circuit blocks or tiles described herein, as well as the interconnect circuitry that selectively couples the various circuit blocks, tiles, and/or elements according to configuration data that is loaded into the IC. For example, portions shown in FIG. 3 that are external to PROC 310 such as CLBs 302 and BRAMs 303 can be considered programmable circuitry of the IC.

The functionality of programmable circuitry is not established until configuration data is loaded into the IC. A set of configuration bits can be used to program programmable circuitry of an IC such as an FPGA. The configuration bit(s) typically are referred to as a "configuration bitstream." As such, programmable circuitry is not operational or functional without first loading a configuration bitstream into the IC. The configuration bitstream effectively implements or instantiates a particular circuit design within the programmable circuitry. The circuit design specifies, for example, functional aspects of the programmable circuit blocks and physical connectivity among the various programmable circuit blocks that is otherwise non-existent.

Circuitry that is "hardwired" or "hardened," i.e., not programmable, is manufactured as part of the IC. Unlike programmable circuitry, hardwired circuitry or circuit blocks are not implemented after the manufacture of the IC through the loading of a configuration bitstream. Hardwired circuitry has dedicated circuit blocks and interconnects, for example, that are functional without first loading a configuration bitstream into the IC, e.g., PROC 310.

In some instances, hardwired circuitry can have one or more operational modes that can be set or selected according to register settings or values stored in one or more memory elements within the IC. The operational modes can be set, for example, through the loading of a configuration bitstream into the IC. Despite this ability, hardwired circuitry is not considered programmable circuitry as the hardwired circuitry is operable typically in a default mode of operation and has a particular function when manufactured as part of the IC.

Particular blocks of architecture 300 such as PROC 310, MGTs 301, and the like may include one or more configuration registers (not shown) that store configuration settings for the blocks.

FIG. 3 is intended to illustrate an exemplary architecture that can be used to implement an IC that includes programmable circuitry, e.g., a programmable fabric. For example, the number of logic blocks in a column, the relative width of the columns, the number and order of columns, the types of logic blocks included in the columns, the relative sizes of the logic blocks, and the interconnect/logic implementations included at the top of FIG. 3 are purely exemplary. In an actual IC, for example, more than one adjacent column of CLBs is typically included wherever the CLBs appear, to facilitate the efficient implementation of a user circuit design. The number of adjacent CLB columns, however, can vary with the overall size of the IC. Further, the size and/or positioning of blocks such as PROC 310 within the IC are for purposes of illustration only and are not intended as a limitation.

Figure 4:
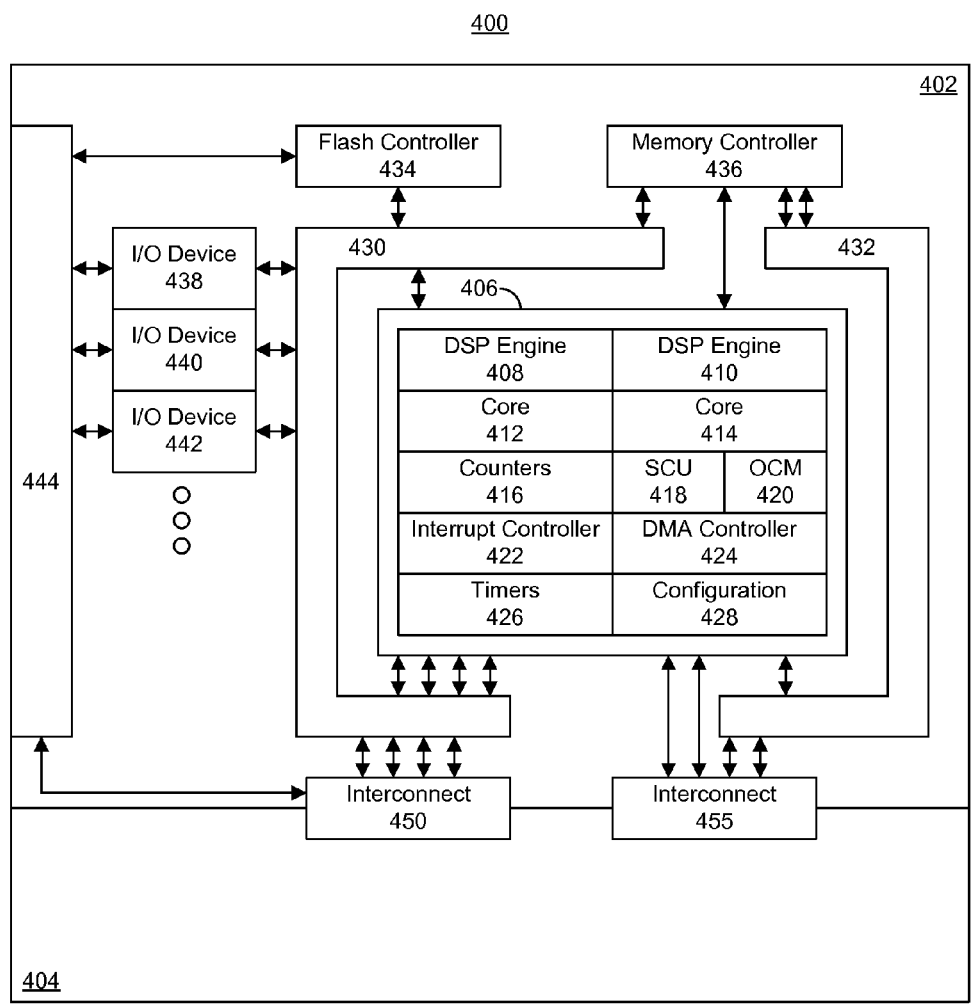
FIG. 4 is a block diagram illustrating another exemplary architecture for an IC.

FIG. 4 is a block diagram illustrating another exemplary architecture 400 for an IC. For example, architecture 400 may be used to implement IC 120 of FIG. 1. In one aspect, architecture 400 is implemented within a field programmable gate array (FPGA) type of IC. Further, architecture 400 is another example of an SOC.

Architecture 400 includes a processor system 402 and programmable circuitry 404. Processor system 402 is hardwired. As such, the various elements pictured within processor system 402 exist within IC 120 without first having to load configuration data, i.e., a configuration bitstream. By comparison, programmable circuitry 404 is not hardwired. Programmable circuitry 404, as described herein, includes one or more programmable circuit blocks or tiles that are configured to form particular circuit structures and/or systems that perform particular operations and/or functions only after configuration data is loaded.

Processor system 402 includes a processor complex 406, also referred to as a processor. In the example shown, processor complex 406 includes two cores. It should be appreciated, however, that processor complex 406 may be a single core processor or include more than two cores. Processor complex 406 includes DSP engines 408 and 410, cores 412 and 414, counters 416, a snoop control unit (SCU) 418, and an on-chip memory (OCM) 420. Processor complex 406 also includes an interrupt controller 422, a direct memory access (DMA) controller 424, timers 426, and configuration block 428.

Core complex 406 is communicatively linked with other elements within processor system 402 through interconnects 430 and 432. One example of an interconnect structure that may be used to implement interconnects 430 and/or 432 is the Advanced Microcontroller Bus Architecture (AMBA®) Interconnect available from ARM Inc. Interconnects 430 and 432 provide on-chip connection and management of functional blocks in an SOC.

Interconnect 430 couples core complex 406 to a flash controller 434, memory controller 436, and one or more I/O devices 438, 440, and 442. Memory controller 436 may be dynamic RAM controller or any of a variety of memory controllers configured to communicate with a RAM located external to the IC including architecture 400. Interconnect 430 further couples to interconnect 450. Interconnect 450 provides communication links into programmable circuitry 404 that couple various circuits and/or systems that may be implemented within programmable circuitry 404 to processor system 402. Interconnect 432 couples core complex 406 to memory controller 436 and to interconnect 455. Interconnect 455 provides communication links into programmable circuitry 404 that couple the various circuits and/or systems that may be implemented within programmable circuitry 404 to processor system 402. As shown, memory controller 436 also is directly coupled to core complex 406.

I/O devices 438, 440, and 442 are representative of a plurality of different types of I/O devices, e.g., peripherals, that may be included within processor system 402. Processor system 402 may include more or fewer I/O devices than shown. Exemplary I/O devices represented by I/O devices 438, 440, and 442 may include, but are not limited to, one or more of a Serial Peripheral Interface (SPI) bus, an Inter-Integrated Circuit ($I^2C$) bus, a Controller Area Network (CAN) bus, a Universal Asynchronous Receiver/Transmitter (UART), a General Purpose Input/Output (GPIO), a Secure Digital Input Output (SDIO) with DMA, a USB with DMA, a gigabit Ethernet (GigE) with DMA, or the like.

I/O devices 438, 440, and 442 are coupled to an I/O multiplexer 444. I/O multiplexer 444 receives signals from I/O devices 438, 440, and 442, and from flash controller 434, and selectively routes the signals to output pins of the IC and/or into programmable circuitry 404. Similarly, signals received from output pins of the IC may be selectively routed into programmable circuitry 404 and/or into one or more of I/O devices 438, 440, and/or 442, and/or flash controller 434.

Within FIG. 4, examples of subsystems that have configuration settings include, but are not limited to, core complex 406, memory controller 436, Flash controller 434, and one or more or each of I/O devices 438, 440, and 442. In one aspect, configuration settings for a subsystem are implemented as one or more configuration registers that store values for the configuration settings. Each configuration register may store one or more values. Each configuration setting is specified by one value. Thus, each of memory controller 436, Flash controller 434, and I/O devices 438, 440, and 442 may include one or more configuration registers (not shown) that store values for configuration settings. Core complex 406 may include one or more configuration registers within configuration block 428.

The architectures described with reference to FIGS. 3 and 4 are provided for purposes of illustration only and are not intended to be limiting of the inventive arrangements described within this disclosure. An SOC may take any of a variety of different forms and include any of a variety of different subsystems with varying connectivity among subsystems. Despite the variability in system architectures, an SOC typically undergoes a boot process. The boot process may include one or more different stages during which various subsystems are configured for operation.

Referring to FIGS. 3 and 4, for example, during a first stage of the boot process, particular subsystems of the SOC may be configured for use prior to others. In illustration, during a first stage of the boot process, a first stage boot loader may be provided to the SOC. The first stage boot loader may load values for configuration settings for particular subsystems such as the memory controller. After completion of the first stage of the boot process, the memory controller is available for usage even within further stages of the boot process. For example, once configured, the memory controller then may be used to read an operating system and/or applications from an external memory that may be executed by a processor of the SOC.

As previously noted, static configuration settings of some subsystems may only be changed through initiating of a boot process within the SOC. Initiating a boot process also may be referred to as resetting or rebooting the SOC. In illustration, a configuration setting for the memory controller may only be changed during the first stage of the boot process, i.e., by loading a first stage boot loader including the desired data for the configuration setting of the memory controller. The configuration setting of the memory controller is one example of a static configuration setting. In that case, the data processing system may generate a first stage boot loader specifying the desired data for the configuration setting, provide the configuration data to the SOC, and trigger a boot process of the SOC using the configuration data. Once initiated, the first stage boot loader loads the desired data for the configuration setting for the memory controller.

Another example of a static configuration setting may include modifying microcode of a processor within the SOC if such actions are permitted. For example, the SOC may be restarted by initiating a boot process. During the boot process of the SOC, the processor may be placed in a state where the microcode of the processor may be modified. The data processing system may send configuration data including the desired data for a configuration setting of the SOC. In this case, the desired data for the configuration setting is microcode, e.g., a microcode patch, to be applied to the processor. During the boot process, the microcode from the configuration data is applied to the processor.

Other configuration settings are dynamic. As noted, dynamic configuration settings may be modified during operation of the SOC without implementing a boot process for the SOC. An example of a dynamic configuration setting includes, but is not limited to, an operating frequency of the processor, an operating frequency of one or more circuits of the programmable circuitry, or the like. Other examples of dynamic configuration settings include changes at the operating system layer or the application layer for program code executing in the processor of the SOC. For example, changing and/or reloading the operating system, changing the application program that is executed, or the like may be performed without initiating a boot process. For example, a configuration setting of a hypervisor application and/or a virtual machine may require terminating execution of the appropriate application or virtual machine, updating the configuration setting, and re-executing the application or virtual machine, but does not require implementing a boot process for the SOC.

Figure 5:
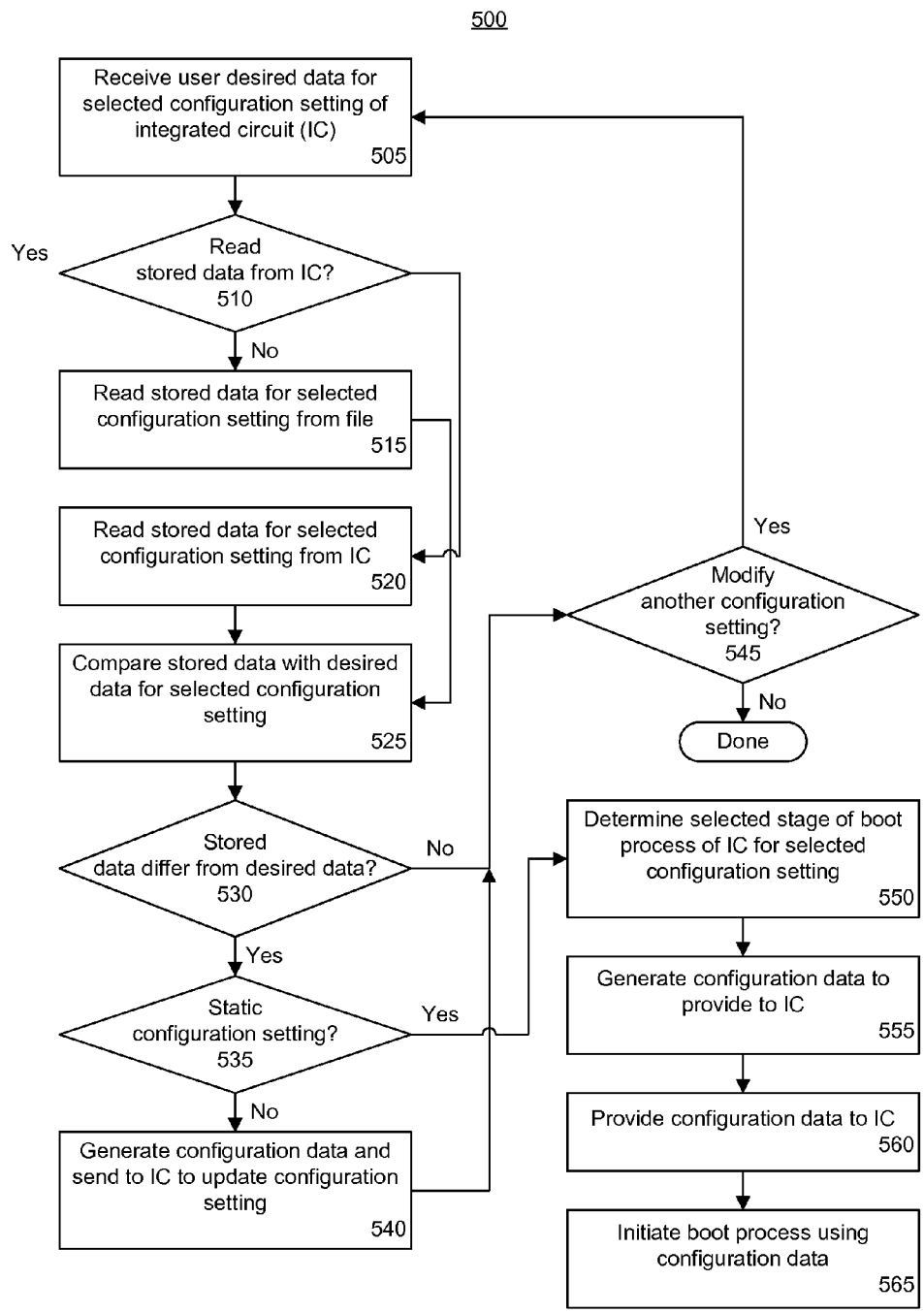
FIG. 5 is a flow chart illustrating an exemplary method of automatically modifying configuration settings of an IC.

FIG. 5 is a flow chart illustrating an exemplary method 500 of automatically modifying configuration settings of an SOC. Method 500 may be implemented by a system such as development system 100 described with reference to FIG. 1. More particularly, method 500 is performed by a data processing system that is coupled to the IC, which implements an SOC. The SOC includes one or more subsystems that have configuration settings stored within configuration registers.

In block 505, the data processing system receives user desired data for a user selected configuration setting. The user can provide the desired data and indicate the selected configuration setting to be updated through a user interface generated by the data processing system in executing the development application.

In block 510, the data processing system optionally determines whether to read stored data from the IC. For example, the data processing system optionally determines whether to read a value for the selected configuration setting from the IC. If so, method 500 continues to block 520. If not, method 500 proceeds to block 515. For example, as part of loading configuration data within the IC, the value(s) of one or more or all configuration settings loaded into the IC may be stored within a file such as a metadata file either within, or accessible by, the data processing system. The file may be used to obtain the value of the selected configuration setting currently stored in the IC in lieu of reading the value from the IC.

Method 500 may proceed to block 515, for example, in the case where the data processing system is unable to access, or read from, the IC and a file including a value of the selected configuration setting currently stored within the IC is available. In another example, method 500 may proceed to block 515 if a file including the value of the selected configuration setting currently stored within the IC is available regardless of whether the data processing system is able to access, or read from, the IC.

In another example, method 500 may proceed to block 520 if the data processing system is able to access the IC regardless of the availability of a file including the value of the selected configuration setting currently stored within the IC. In still another example, method 500 may proceed to block 520 if the data processing system is able to access the IC and a file including the value of the selected configuration setting currently stored in the IC is not available. Block 510 is described as optional since method 500 may be implemented in a way that always presumes that stored data may be read from the IC or implemented in a way that always presumes that stored data may be obtained or read from a metadata file.

In block 515, the data processing system reads stored data for the selected configuration setting from the file. The file stores a value for one or more or all configuration settings of a prior configuration of the IC. The values stored in the file are presumed to be the value(s) of configuration settings currently stored within the IC, e.g., the prior configuration of the IC. The data processing system may read the value of the selected configuration setting from the file.

In block 520, the data processing system performs a read, or read back, from the IC for the stored data for the selected configuration setting from the IC. More particularly, the data processing system reads the value of the selected configuration setting stored within the IC.

In block 525, the data processing system compares the stored data with the desired data for the selected configuration setting. In block 530, the data processing system determines whether the desired data differs from the stored data. If so, method 500 proceeds to block 535. If not, method 500 proceeds to block 545.

Continuing with block 535, the data processing system has determined that the stored data does not match the desired data. In block 535, the data processing system determines whether the configuration setting is static. If so, method 500 continues to block 550. If not, the data processing system determines that the configuration setting is dynamic and continues to block 540. For example, the data processing system may look up the configuration setting with the configuration setting data stored therein to determine the status of the configuration register as static or dynamic.

In block 540, responsive to determining that the configuration setting is a dynamic configuration setting, the data processing system generates the configuration data needed to update the selected configuration setting within the IC. The configuration data may include one or more instructions and includes the desired data for the selected configuration setting. The data processing system sends the configuration data to the IC. Responsive to receiving the configuration data, the IC updates the stored data for the configuration setting to the desired data received in block 505. The data processing system, for example, communicates with the IC over the communication link and updates the configuration setting to the desired data, e.g., writes the desired data to a configuration register for the selected configuration setting. As part of block 540, no restart or other boot process of the IC is required.

After block 540, method 500 continues to block 545. In block 545, the data processing system determines whether the user wishes to modify another configuration setting. If so, method 500 loops back to block 505. If not, method 500 may end.

Continuing with block 550, the data processing system has determined that the selected configuration setting is a static configuration setting. As noted, a static configuration setting requires implementation of a boot process for the IC or at least a portion of the boot process of the IC, i.e., a partial boot process. In block 550, the data processing system determines the particular, i.e., "selected," stage of the boot process of the IC where the selected configuration setting may be updated. Thus, the selected stage is one of a plurality of different stages of the boot process where the value of the selected configuration setting may be changed or otherwise updated within the IC. As noted, the selected stage of a static configuration setting may be specified within the configuration setting data stored within the data processing system.

For example, in some cases, a subsystem may have one or more configuration registers that may be written only during a first stage or only during a second stage of the boot process. In that case, the boot process must be implemented within the IC in order to change the configuration setting from the stored data to the desired data. The term "value," in the context of a configuration setting, may be a numerical value, e.g., whether binary, hexadecimal, etc., microcode, an address of program code, a patch, an address of a virtual machine, or the like.

In block 555, the data processing system generates configuration data that updates the configuration setting to the desired data. The configuration data is specific to the particular stage of the boot process where the selected configuration setting must be updated. For example, the configuration data may be a first stage boot loader that includes the desired data, second stage configuration data, or the like.

In block 560, the data processing system provides the configuration data to the IC. The configuration data is provided over the communication link between the data processing system and the target platform. In block 565, the data processing system initiates the boot process using the configuration data. For example, the data processing system may reset the IC in its entirety allowing a first stage boot loader specifying the desired data to be provided to the IC. In that case, the IC implements the boot process in its entirety and executes the first stage boot loader.

In another example, the configuration data may be provided to the IC with an instruction to implement the boot process beginning at the selected stage where the selected stage is not the first stage in an ordered set of two or more stages forming the boot process. In that case, the configuration data includes "selected" stage boot process data, etc. In one aspect, the data processing system initiates the boot process for, or from, a particular location within the boot process. As defined herein, a "partial boot process" or an "incremental boot process" is where the IC performs fewer than all stages of a boot process. For example, the IC may start from a stage that is not the first stage of the ordered set of stages forming the boot process, skip one or more stages, or end at a stage that is not the last of the ordered set of stages forming the boot process.

While FIG. 5 is described with reference to a single configuration setting, in another example, multiple configuration settings may be updated during an iteration of method 500. For example, anytime at least one configuration setting of a plurality of configuration settings to be updated has desired data that differs from the stored data and is static, the data processing system may generate the configuration data as needed and initiate the boot process using the configuration data. Further, configuration data specifying desired data for multiple configuration settings associated with multiple, different stages of the boot process may be provided and used during the boot process.

The inventive arrangements described within this disclosure relate to automatically modifying configuration settings of an SOC type of IC. In accordance with the inventive arrangements disclosed herein, one or more configuration settings of an IC may be automatically updated or changed. The configuration settings may be change through an automated process where the user of the SOC need not know the particular requirements for modifying the configuration setting(s). This allows the user to try many different values for any of a variety of different configuration settings quickly and easily. Tasks such as generating configuration data and rebooting the SOC are performed automatically without user intervention as needed depending upon the particular configuration setting(s) that are to be updated.

For purposes of explanation, specific nomenclature is set forth to provide a thorough understanding of the various inventive concepts disclosed herein. The terminology used herein, however, is for the purpose of describing particular aspects of the inventive arrangements only and is not intended to be limiting.

The terms "a" and "an," as used herein, are defined as one or more than one. The term "plurality," as used herein, is defined as two or more than two. The term "another," as used herein, is defined as at least a second or more. The term "coupled," as used herein, is defined as connected, whether directly without any intervening elements or indirectly with one or more intervening elements, unless otherwise indicated. Two elements also can be coupled mechanically, electrically, or communicatively linked through a communication channel, pathway, network, or system.

The term "and/or" as used herein refers to and encompasses any and all possible combinations of one or more of the associated listed items. It will be further understood that the terms "includes" and/or "including," when used in this disclosure, specify the presence of stated features, integers, steps, operations, elements, and/or components, but do not preclude the presence or addition of one or more other features, integers, steps, operations, elements, components, and/or groups thereof. It will also be understood that, although the terms first, second, etc. may be used herein to describe various elements, these elements should not be limited by these terms, as these terms are only used to distinguish one element from another.

The term "if" may be construed to mean "when" or "upon" or "in response to determining" or "in response to detecting," depending on the context. Similarly, the phrase "if it is determined" or "if [a stated condition or event] is detected" may be construed to mean "upon determining" or "in response to determining" or "upon detecting [the stated condition or event]" or "in response to detecting [the stated condition or event]," depending on the context.

Within this disclosure, the same reference characters are used to refer to terminals, signal lines, wires, and their corresponding signals. In this regard, the terms "signal," "wire," "connection," "terminal," and "pin" may be used interchangeably, from time-to-time, within this disclosure. It also should be appreciated that the terms "signal," "wire," or the like can represent one or more signals, e.g., the conveyance of a single bit through a single wire or the conveyance of multiple parallel bits through multiple parallel wires. Further, each wire or signal may represent bi-directional communication between two, or more, components connected by a signal or wire as the case may be.

One or more aspects described within this disclosure can be realized in hardware or a combination of hardware and software. One or more aspects can be realized in a centralized fashion in one system or in a distributed fashion where different elements are spread across several interconnected systems. Any kind of data processing system or other apparatus adapted for carrying out at least a portion of the methods described herein is suited.

One or more aspects further can be embedded in a computer program product, which includes all the features enabling the implementation of the methods described herein. The computer program product includes a data storage medium which is a non-transitory computer-usable or computer-readable medium, storing program code that, when loaded and executed in a system including a processor, causes the system to initiate and/or perform at least a portion of the functions and/or operations described within this disclosure. Examples of data storage media can include, but are not limited to, optical media, magnetic media, magneto-optical media, computer memory such as random access memory, a bulk storage device, e.g., hard disk, or the like.

Accordingly, the flowchart and block diagrams in the Figures illustrate the architecture, functionality, and operation of possible implementations of systems, methods and computer program products according to various aspects of the inventive arrangements disclosed herein. In this regard, each block in the flowchart or block diagrams may represent a module, segment, or portion of code, which includes one or more executable instructions for implementing the specified logical function(s). It should also be noted that, in some alternative implementations, the functions noted in the blocks may occur out of the order noted in the figures. For example, two blocks shown in succession may be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

The terms "computer program," "software," "application," "computer-usable program code," "program code," "executable code," variants and/or combinations thereof, in the present context, mean any expression, in any language, code or notation, of a set of instructions intended to cause a data processing system to perform a particular function either directly or after either or both of the following: a) conversion to another language, code, or notation; b) reproduction in a different material form. For example, program code can include, but is not limited to, a subroutine, a function, a procedure, an object method, an object implementation, an executable application, an applet, a servlet, a source code, an object code, a shared library/dynamic load library and/or other sequence of instructions designed for execution on a computer system.

Thus, throughout this disclosure, statements utilizing terms such as "processing" or "computing" or "calculating" or "determining" or "displaying" or the like, refer to the action and processes of a data processing system, e.g., a computer system, or similar electronic computing device, that manipulates and transforms data represented as physical (electronic) quantities within the computer system's registers and/or memories into other data similarly represented as physical quantities within the computer system memories and/or registers or other such information storage, transmission or display devices.

The corresponding structures, materials, acts, and equivalents of all means or step plus function elements in the claims below are intended to include any structure, material, or act for performing the function in combination with other claimed elements as specifically claimed.

A method includes receiving, within a data processing system, desired data for a configuration setting of an IC, reading stored data for the configuration setting, and determining, using the data processing system, that the configuration setting is static and that the stored data differs from the desired data. The method also includes, responsive to the determining, providing configuration data including the desired data from the data processing system to the IC and automatically initiating at least a portion of a boot process of the IC using the configuration data.

The method further includes determining a selected stage from a plurality of stages of the boot process of the IC where modification of the configuration setting is permitted. The desired data is stored as the configuration setting within the IC during the selected stage of the boot process.

In one aspect, the configuration setting controls a hardwired IP circuit block of the IC. In one example, the configuration setting of the IC may control a memory controller. In another example, the configuration setting of the IC may control a processor.

In a further aspect, the desired data includes a first stage boot loader. In another aspect the desired data includes microcode.

The method also may include initiating the boot process from a stage of the boot process other than a first stage of the boot process.

A data processing system includes a processor programmed to initiate executable operations. The executable operations include receiving desired data for a configuration setting of an IC, reading stored data for the configuration setting, and determining that the configuration setting is static and that the stored data differs from the desired data. The executable operations also include, responsive to the determining, providing configuration data comprising the desired data to the IC and automatically initiating at least a portion of a boot process of the IC using the configuration data.

The processor further may be programmed to initiate executable operations including determining a selected stage from a plurality of stages of the boot process of the IC where modification of the configuration setting is permitted. The desired data is stored as the configuration setting within the IC during the selected stage of the boot process.

In one aspect, the configuration setting controls a hardwired IP circuit block of the IC. In one example, the configuration setting of the IC controls a memory controller. In another example, the configuration setting of the IC controls a processor.

In a further aspect, the desired data includes a first stage boot loader. In another aspect, the desired data includes microcode.

The processor may be further programmed to initiate executable operations including initiating the boot process from a stage of the boot process other than a first stage of the boot process.

A non-transitory computer-readable medium has instructions stored thereon which, when executed by a processor, perform a method. The method includes receiving, within a data processing system having the processor, desired data for a configuration setting of an IC, reading stored data for the configuration setting, and determining, using the processor of the data processing system, that the configuration setting is static and that the stored data differs from the desired data. The method also may include, responsive to the determining, providing configuration data including the desired data from the data processing system to the IC and automatically initiating at least a portion of a boot process of the IC using the configuration data.

The method further may include determining a selected stage from a plurality of stages of the boot process of the IC where modification of the configuration setting is permitted. The desired data is stored as the configuration setting within the IC during the selected stage of the boot process.

In one aspect, the configuration setting controls a hardwired IP circuit block of the IC.

In another aspect, the desired data includes at least one of a first stage boot loader and microcode.

The features described within this disclosure can be embodied in other forms without departing from the spirit or essential attributes thereof. Accordingly, reference should be made to the following claims, rather than to the foregoing disclosure, as indicating the scope of such features and implementations.

What is claimed is:

1. A method, comprising:
   receiving, within a data processing system, desired data for a configuration setting of an IC, wherein the IC is a system-on-chip;
   reading, using the data processing system, stored data for the configuration setting;
   comparing, using the data processing system, the stored data with the desired data;
   determining, using the data processing system, whether updating the configuration setting within the IC requires implementation of at least a portion of a boot process of the IC;
   determining a selected stage from a plurality of ordered stages of the boot process of the IC where modification of the configuration setting is permitted, wherein the selected stage is subsequent to a first stage; and
   responsive to the determining that updating the configuration setting within the IC requires implementing at least the portion of the boot process and that the stored data differs from the desired data by the comparing, providing configuration data to the IC, wherein the configuration data comprises the desired data from the data processing system and an instruction to implement the boot process of the IC from the selected stage, wherein the IC automatically initiates the boot process from the selected stage of the boot process using the configuration data.

2. The method of claim 1, wherein the configuration setting controls a hardwired intellectual property circuit block of the IC.

3. The method of claim 2, wherein the configuration setting of the IC controls a memory controller.

4. The method of claim 2, wherein the configuration setting of the IC controls a processor.

5. The method of claim 1, wherein the desired data comprises a first stage boot loader.

6. The method of claim 1, wherein the desired data comprises microcode.

7. The method of claim 1, wherein:
   the stored data for the configuration setting is read from the IC.

8. A data processing system, comprising:
   a processor programmed to initiate executable operations comprising:
   receiving desired data for a configuration setting of an IC, wherein the IC is a system-on-chip;
   reading stored data for the configuration setting;
   comparing, using the data processing system, the stored data with the desired data;
   determining, using the data processing system, whether updating the configuration setting within the IC requires implementation of at least a portion of a boot process of the IC;
   determining a selected stage from a plurality of ordered stages of the boot process of the IC where modification of the configuration setting is permitted, wherein the selected stage is subsequent to a first stage; and responsive to the determining that updating the configuration setting within the IC requires implementing at least a portion of the boot process and that the stored data differs from the desired data by the comparing, providing configuration data to the IC, wherein the configuration data comprises the desired data and an instruction to implement the boot process of the IC from the selected stage, wherein the IC automatically initiates the boot process from the selected stage of the boot process using the configuration data.

9. The data processing system of claim 8, wherein the configuration setting controls a hardwired intellectual property circuit block of the IC.

10. The data processing system of claim 9, wherein the configuration setting of the IC controls a memory controller.

11. The data processing system of claim 9, wherein the configuration setting of the IC controls a processor.

12. The data processing system of claim 8, wherein the desired data comprises a first stage boot loader.

13. The data processing system of claim 8, wherein the desired data comprises microcode.

14. The data processing system of claim 8, wherein:
the stored data for the configuration setting is read from the IC.

15. A non-transitory computer-readable medium having instructions stored thereon which, when executed by a processor, perform a method comprising:
receiving, within a data processing system comprising the processor, desired data for a configuration setting of an IC, wherein the IC is a system-on-chip;
reading stored data for the configuration setting;
comparing, using the data processing system, the stored data with the desired data;
determining, using the data processing system, whether updating the configuration setting within the IC requires implementation of at least a portion of a boot process of the IC;
determining a selected stage from a plurality of ordered stages of the boot process of the IC where modification of the configuration setting is permitted, wherein the selected stage is subsequent to a first stage; and
responsive to the determining that updating the configuration setting within the IC requires implementing at least the portion of the boot process and that the stored data differs from the desired data by the comparing, providing configuration data to the IC, wherein the configuration data comprises the desired data from the data processing system and an instruction to implement the boot process of the IC from the selected stage, wherein the IC automatically initiates the boot process from the selected stage of the boot process using the configuration data.

16. The non-transitory computer-readable medium of claim 15, wherein the configuration setting controls a hardwired intellectual property circuit block of the IC.

17. The non-transitory computer-readable medium of claim 15, wherein the desired data comprises at least one of a first stage boot loader and microcode.

18. The method of claim 2, wherein the IC comprises programmable circuitry coupled to a processor system and the hardwired intellectual property circuit block is within the processor system.

19. The data processing system of claim 9, wherein the IC comprises programmable circuitry coupled to a processor system and the hardwired intellectual property circuit block is within the processor system.

20. The non-transitory computer-readable medium of claim 16, wherein the IC comprises programmable circuitry coupled to a processor system and the hardwired intellectual property circuit block is within the processor system.

* * * * *